US009229060B1

(12) United States Patent
Mahoney

(10) Patent No.: US 9,229,060 B1
(45) Date of Patent: Jan. 5, 2016

(54) ELECTRONIC CIRCUIT TESTER AND METHOD OF USE

(71) Applicant: Mark D. Mahoney, Fountain Hills, AZ (US)

(72) Inventor: Mark D. Mahoney, Fountain Hills, AZ (US)

(73) Assignee: Voltmarc Technology, Inc., Phoenix, AZ (US)

( * ) Notice: Subject to any disclaimer, the term of this patent is extended or adjusted under 35 U.S.C. 154(b) by 202 days.

(21) Appl. No.: 13/933,031

(22) Filed: Jul. 1, 2013

Related U.S. Application Data

(60) Division of application No. 12/752,276, filed on Apr. 1, 2010, now Pat. No. 8,493,060, which is a continuation of application No. 11/670,089, filed on Feb. 1, 2007, now abandoned, which is a continuation-in-part of application No. 10/997,009, filed on Nov. 24, 2004, now Pat. No. 7,327,274.

(60) Provisional application No. 60/525,004, filed on Nov. 25, 2003.

(51) Int. Cl.
*G01R 7/00* (2006.01)
*G01R 31/327* (2006.01)

(52) U.S. Cl.
CPC .................... *G01R 31/327* (2013.01)

(58) Field of Classification Search
CPC .. G01R 31/021; G01R 31/023; G01R 31/041; G01R 19/145; G01R 19/15; G01R 21/133; G01R 31/024; G01R 15/18; G01R 31/327; G01R 31/3271–31/3278

USPC ...... 324/66, 67, 76.11, 126, 127, 140 R, 142, 324/713; 340/638; 702/64
See application file for complete search history.

(56) References Cited

U.S. PATENT DOCUMENTS

| | | | |
|---|---|---|---|
| 3,623,142 A | 11/1971 | Key | |
| 3,982,181 A | 9/1976 | Ferony et al. | |
| 4,121,152 A | 10/1978 | Hale et al. | |
| 4,491,785 A | 1/1985 | Pecukonis | |
| 4,556,839 A | 12/1985 | George | |
| 4,734,638 A * | 3/1988 | Weber | 324/66 |
| 4,833,564 A | 5/1989 | Pardue et al. | |
| 5,309,310 A | 5/1994 | Baer et al. | |
| 5,426,360 A * | 6/1995 | Maraio et al. | 324/126 |
| 5,493,206 A * | 2/1996 | Boons | 324/66 |
| 5,586,043 A * | 12/1996 | Breen et al. | 702/64 |
| 5,969,516 A | 10/1999 | Wottrich | |
| 6,054,931 A | 4/2000 | Wottrich | |
| 6,163,144 A * | 12/2000 | Steber et al. | 324/67 |
| 6,166,532 A | 12/2000 | Coia et al. | |
| 6,222,358 B1 | 4/2001 | Wottrich | |
| 6,426,632 B1 | 7/2002 | Clunn | |
| 6,621,268 B2 | 9/2003 | Usaki | |

(Continued)

OTHER PUBLICATIONS

Final Office Action dated Dec. 3, 2009, in U.S. Appl. No. 11/670,089. pp. 2-6.

*Primary Examiner* — Arleen M Vazquez
*Assistant Examiner* — Lee Rodak
(74) *Attorney, Agent, or Firm* — Venjuris, P.C.

(57) ABSTRACT

An electrical circuit tester including a resistive load and a testing station for detecting the variable load. The testing station includes at least one electrical current transducer capable of detecting the variable load in an adjacent electrical power circuit. The detection of the variable load is communicated to the testing station and a variable load detection function.

8 Claims, 6 Drawing Sheets

(56) References Cited

U.S. PATENT DOCUMENTS

| | | |
|---|---|---|
| 6,737,854 B2 | 5/2004 | Bruno et al. |
| 6,937,003 B2 | 8/2005 | Bowman et al. |
| 7,385,406 B1 | 6/2008 | Blades |
| 7,493,222 B2 | 2/2009 | Bruno |
| 2002/0030476 A1* | 3/2002 | Budniak et al. .......... 324/67 |
| 2003/0151413 A1* | 8/2003 | Elms ..................... 324/541 |
| 2003/0184280 A1 | 10/2003 | Bowman et al. |
| 2004/0136125 A1 | 7/2004 | Nemir et al. |
| 2006/0033485 A1 | 2/2006 | Konopka |
| 2009/0289616 A1* | 11/2009 | Suozzo et al. .......... 324/66 |

* cited by examiner

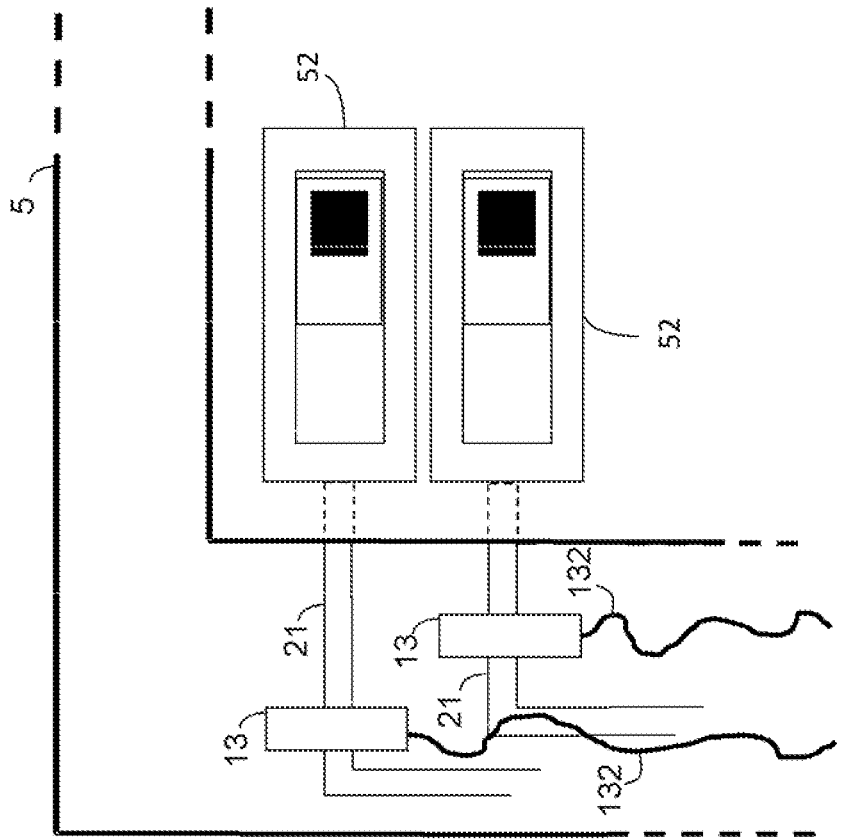
Figure 3
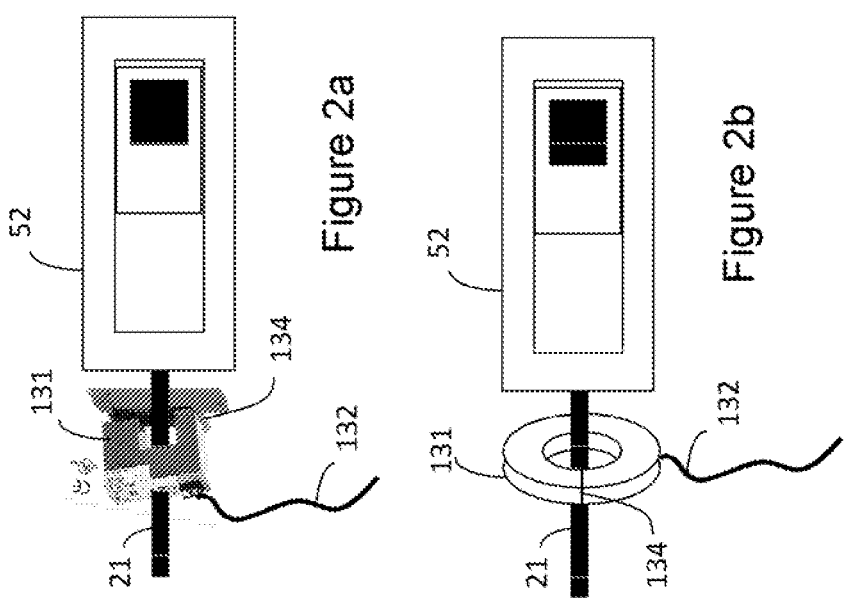
Figure 2a
Figure 2b

ELECTRONIC CIRCUIT TESTER AND METHOD OF USE

CROSS-REFERENCE TO RELATED APPLICATIONS

This application is a divisional of pending application Ser. No. 12/752,276, filed Apr. 4, 2010, which is continuation of pending application Ser. No. 11/670,089, filed Feb. 1, 2007, which is a continuation-in-part of application Ser. No. 10/997,009, filed Nov. 24, 2004, which issued as U.S. Pat. No. 7,327,274 on Feb. 5, 2008, and which claims the benefit of provisional application No. 60/525,004, filed Nov. 25, 2003.

BACKGROUND OF THE INVENTION

The invention is applicable to the field of test equipment for electrical power circuits.

DESCRIPTION OF THE RELATED ART

Both commercial and residential buildings include electrical circuits that power lights, appliances, and consumer electronics. Buildings generally have a common access point such as a circuit breaker panel that provides a hookup to the power utility tap. Electric power is distributed throughout the building on or with electrically isolated circuits to various rooms in the building. The circuit breaker panel comprises a plurality of electromechanical switches that connect each isolated circuit to the power utility tap. Electric power from each electrical circuit is accessed at a plurality of plug receptacles or wires connected directly to ballasts.

When a building is constructed, it is common to plan and label the circuits together with the circuit breakers. Despite that best practices are to preserve the plan and labeling of the circuits, it is common to lose the plan or the labeling showing which circuits in the building are associated with which circuit breakers. Loss of the plan or the labeling generally makes subsequent changes more difficult and hence more costly. Accordingly, it is desirable to quickly determine which electrical circuits are associated with which circuit breakers.

Each of the following United States patents or publications presents a solution to the above problem: U.S. Pat. Nos. 3,623,142; 3,982,181; 4,121,152; 4,491,785; 4,556,839; 4,642,556; 4,906,938; 5,497,094; 5,969,516; 6,054,931; 6,166,532; 6,222,358; and 20060033485. Still, none disclose or suggest the following invention.

BRIEF SUMMARY OF THE INVENTION

The present invention comprises an electrical circuit tester which is useful for determining information about electrical power circuits. The tester includes at least one load variation device and a testing station. The testing station includes at least one electrical current transducer capable of detecting the load current conditions in an adjacent electrical power circuit. The load current conditions are input to the testing station and a load variation device detection function, which detects the load conditions on the adjacent electrical power circuit and particularly, the load conditions imposed by the at least one load variation device.

Accordingly, it is an object of the invention to provide an electrical circuit tester including a variable load connected between a live contact and a neutral contact; at least one electrical current transducer having a transducer output, the electrical current transducer functionally coupled to the variable load; and a portable testing station comprising, a variable load detection function in communication with the transducer output, and a display device in communication with the transducer output; whereby, the variable load detection function identifies the variable load and displays a representation of the identified variable load on the display device.

It is a further object of the invention to communicate remotely with a portable display terminal. As such, it is an object to have an electrical circuit tester, comprising: a load variation device, including a variable load connected between a live contact and a neutral contact; a portable display terminal; at least one electrical current transducer in communication with the variable load and having a transducer output; and a testing station further comprising; a transducer input in communication with a memory device the memory device in communication with the portable display terminal.

Finally, it is an object of the invention to test an electrical circuit by coupling a variable load to an electrical circuit by coupling the variable load across the hot and neutral wires of the electrical circuit; inducing magnetic flux in the electrical circuit by varying the variable load; functionally coupling a transducer transformer to the electrical circuit by positioning the transducer transformer in the magnetic flux; sensing the induced magnetic flux; and communicating the sensed magnetic flux to a display device. It is a further object to communicate the sensed magnetic field over a wireless link to a portable display terminal.

BRIEF DESCRIPTION OF THE DRAWINGS

FIG. 2a illustrates a first commercially available transducer 13 that couples to an electrical conductor 21.

FIG. 2b illustrates a second commercially available transducer 13 that couples to an electrical conductor 21.

FIG. 3 illustrates a circuit access panel 5 having circuit breakers 52 and at least two transducers 13 functionally coupled to the conductors 21 associated with the circuit breakers 52.

DETAILED DESCRIPTION OF THE EMBODIMENTS

Figure 1:
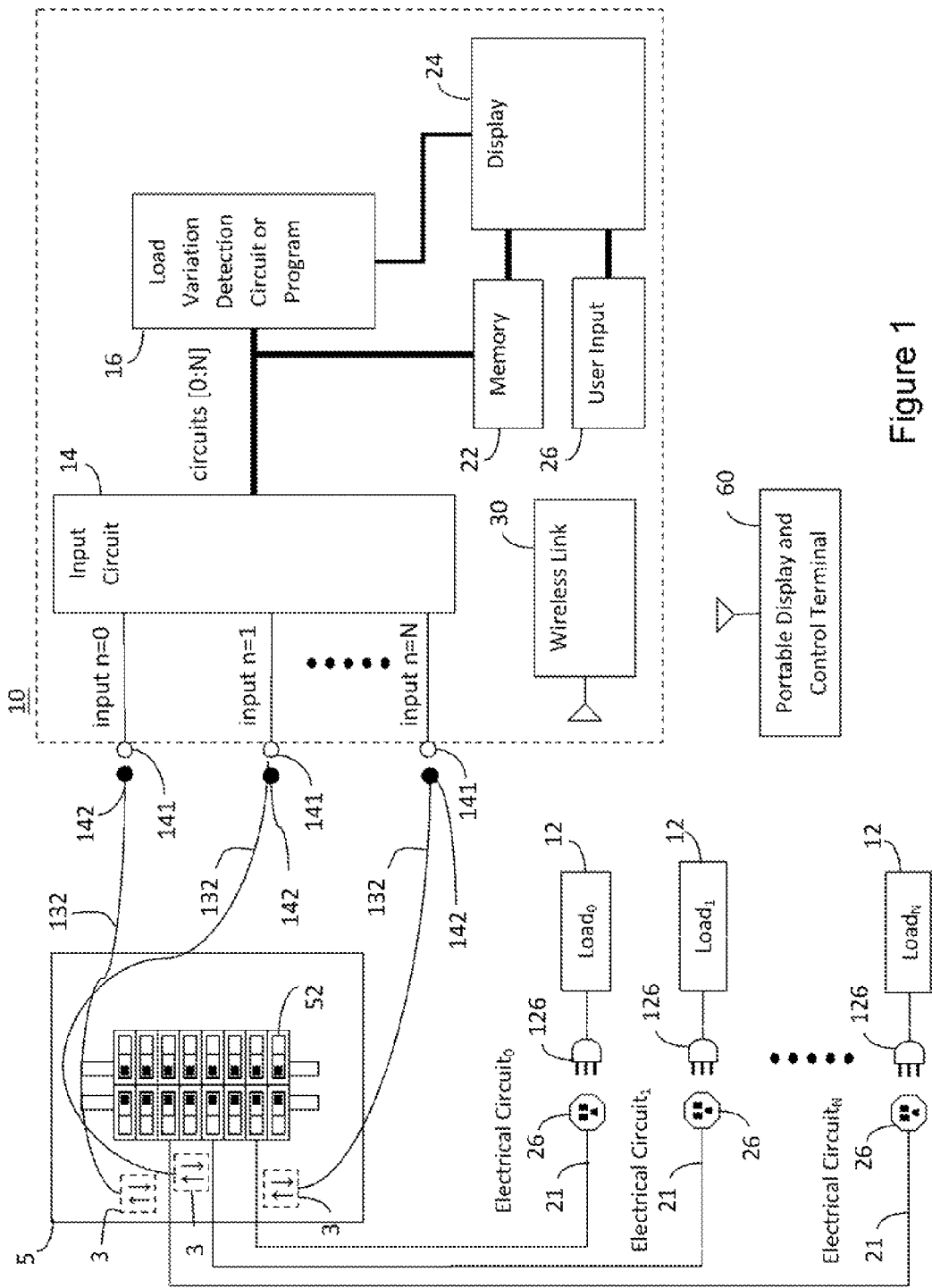
FIG. 1 illustrates a logical block diagram of an electrical circuit testing station 10 coupled to transducers that are functionally coupled 3 to electrical conductors 21 accessible at a circuit access panel 5. Load variation devices 12 are coupled to electrical power circuits 21 at plug receptacles 26.

The circuit tester ("tester") described herein is designed to be used to test or determine useful information regarding a power distribution network. For the purposes herein, a power distribution network comprises at least two electrically isolated electrical power circuits that derive power from a common source such as a utility company source. Further, power circuits are ordinarily, but not necessarily, coupled by electrical conductors 21 (e.g. wire) to a common circuit access panel 5. The circuit access panel 5 provides a common and convenient access point for accessing and testing the electric power distribution network. FIG. 1 illustrates a logical block diagram of the electrical circuit tester 10 and the components of a power distribution network.

FIG. 1 illustrates "N" electrical power circuits as Electrical Circuit$_0$, Electrical Circuit$_1$, . . . Electrical Circuit$_N$, where "N" is equal to the total number of electrical power circuits, coupled by conductors 21, to the circuit access panel 5. One or more of the electrical power circuits may provide electrical power for electrically powered devices such as lights, heaters, motors, and ballasts (not illustrated). Further, each of the electrical power circuits in the electric power distribution network are accessible via a plurality of access points, such as plug receptacles 26, for accessing and deriving power from the electrical power circuit to which it is connected.

The standard circuit access panel 5 comprises a physical organization of a plurality of electro mechanical switches that each provide a junction between each of the electrical power circuits and the utility tap providing the common source of electric power to the electric power distribution network. A typical electro mechanical switch is a circuit breaker 52 and a typical physical organization of the plurality of circuit breakers 52 comprises a stack or column in a panel 5. Each circuit breaker 52 is associated with an electrical power circuit, which is a convenient place to access, couple, or connect to an electrical power circuit. It is noted however that alternative circuit access points may be more practical depending on the particular situation or information desired to be collected by the tester. Using the tester allows the operator to determine useful information about each electrical power circuit and learn which receptacles 26 and conductors 21 are associated with which circuit breaker 52, and hence which electric power circuit.

Still referring to FIG. 1, the electrical circuit tester comprises, a circuit testing station 10 removably and functionally coupled 3 to one or more of the electrical power circuits. The tester also includes at least one load variation device 12 that is removably coupled to one or more of the electrical power circuits. A portable display and control terminal 60 permits wireless remote access and control of the testing station 10. Preferred coupling points for the electrical power circuit are a receptacle 26 and a conductor 21 located at or near the circuit access panel 5. Particularly, the load variation device 12 preferably couples to a receptacle 26 and the testing station 10 preferably couples to a conductor 21 near the panel 5. The load variation device 12 includes a connector 126, typically but not necessarily a two or three-prong plug 126, that is compatible and capable of being coupled to the receptacle 26 of the electrical power circuit 2. Moreover, it is preferable to include several load variation devices 12 with the circuit testing station 10 to enable testing or identifying multiple power circuits in programmable sequence.

The preferred load variation device 12 presents a distinguishable load characteristic on an electrical power circuit 2 that permits identification by the testing station 10 of the load variation device 12. The preferred distinguishing load characteristic comprises the imposition of a change to the existing steady state power condition of the power circuit of significance such that the distinguishable load characteristic of the load variation device 12 is detectible independent of whether or not there are existing constant or variable loads present on the power circuit. Accordingly, the tester is used without disturbing or having to power-down the devices coupled to and drawing power from the circuit.

A preferred distinguishable load characteristic comprises a pulsed load condition with pulse waveform characteristics that are known and identifiable or detectable by the testing station 10. Further, the pulsed load condition is maintained for a time sufficient to permit identification by the testing station 10. An exemplary pulsed load condition comprises a relatively significant power draw or load current for a finite period of time. Accordingly, the pulse may have a single occurrence and be of a particular duration, or the pulse may occur more than once, and/or occur on a periodic basis. A preferred value for the relatively significant power consumption is the power associated with a load current of about 0.1 amperes to 10 amperes, however, the preferred load current may be as little as 0.001 amperes and as much as 10,000 amperes. Ultimately, the preferred distinguishable load characteristic specified or used with the tester is that value of imposed load current that is capable of being detected by the software and the components of the circuit testing station 10. Additionally, if multiple load variation devices 12 are used, it is preferable to enable that each load variation device 12 has a unique load characteristic so that each load variation device 12 is distinguishable by the testing station 10 from the other load variation devices 12. Accordingly, in FIG. 1, each load variation device (i.e. Load$_0$, Load$_1$, and Load$_N$) is identifiable by the testing station 10 by its unique and distinguishable load characteristic.

The testing station 10 is preferably housed within a case 50 that secures and protects the circuit testing station 10 electronics from the outside climate. The circuit testing station 10 draws electric power for its electronics by coupling to a source of electric power using a standard plug receptacle 54. Inside the case 50 is a power supply (not shown) that distributes electrical power from the power source coupled to the receptacle 54 to the electrical components within the case 50. The preferred case 50 is structurally organized to promote the portability of the circuit testing station 10. Accordingly, a preferred structure for the case 50 comprises a "suitcase" style structure 51, comprised of hard plastic halves 52A and 52B, respectively, which are connected together on one edge by hinges 513, and securably connectable along on another edge by hardware 514 commonly used to close and secure suitcase halves. A handle 516 and/or wheels (not shown) enable easy transport of the circuit testing station 10. The first half 52A of the structure 51 includes a plurality of compartments 512 for securely storing the plurality of load variation devices 12. The second half 52B of the structure 51 includes the components and electronics facilitating and implementing the testing capabilities disclosed herein. Particularly, preferred components include a user accessible visual display device 55 that is controllable by the user by buttons or knobs 551 to permit changing the displayed data and initiating and operating the testing capabilities of the circuit testing station 10. An antenna attachment receptacle 58 facilitates wireless communication with the portable display and control terminal 60. Also included in the second half 52, but ordinarily concealed to the user are the electronics that implement the capabilities of the circuit testing station 10. Accordingly, the placement of the electronic components in the drawing is for explanatory purposes.

The circuit testing station 10 couples to at least one electrical current transducer 13 that is capable of being functionally coupled 3, or that is functionally coupleable 3, to a conductor 21 associated with electrical power circuit. The electrical current transducer 13 preferably functionally couples 3 to the conductor 21 near or at the circuit access panel 5. In FIG. 1, functional coupling 3 of the transducer 13 and a conductor 21 is represented by complementary up and down arrows (i.e. "↑ ↓"). The transducer 13 includes a transducer output 142, which couples, using a transducer conductor 132, to at least one transducer input 141 associated with the circuit testing station 10. For the purposes of this description the transducer 13 functionally couples 3 to a conductor 21 by detecting or sensing the current in the conductor 21. Moreover, unless otherwise expressed, the transducer 13 may functionally couple 3 to the conductor 21 associated with the electric power circuit using any technique that permits the detection of the current flowing in the conductor 21. It follows that the transducer 13 may couple magnetically, electrically, or by detecting a radiation, such as heat or infrared energy, to a conductor 21 associated with an electric power circuit 2. Finally, it is preferable that the transducer 13 detect the changes in load current in the electrical power circuit conductor 21 induced by a load variation device 12 as described herein.

A first type of a transducer 13 that functionally couples 3 to an electrical power circuit conductor 21 uses magnetic field coupling between the transducer 13 and the conductor 21. A preferred transducer 13 according to this embodiment includes a transducer transformer 131 and a transducer conductor 132. Magnetic field coupling the transducer transformer 131 to the conductor 21 comprises locating the transducer transformer 131 in the magnetic field generated by, or associated with, the electrical power circuit conductor 21. FIGS. 2a-2b illustrate transducers 13 including a transformer 131 particularly well suited for magnetic field coupling as described herein. The transducers 13 comprise a hinged 134 split or solid core transformer loop that can be opened (not shown) and closed around a conductor 21. As illustrated, the transformer 131 encircles, or is located around, the electrical power circuit conductor 21. Further, the illustration shows the transducer 13 coupled relatively close to the circuit breaker 52. The position of the transformer 131 in relation to the conductor 21 generates induced detectable current in the transducer conductor 132 that is representative of the current in the conductor 21. It is preferred that the transducer 13 produce output current in the transducer conductor 132 current that is proportional to the detected current flowing in the conductor 21 associated with the electrical power circuit.

FIG. 3 illustrates positioning of transducers 13 at or near the access panel 5. The preferred manner of locating the transducer 13 in the magnetic field generated by, or associated with, the electrical power circuit conductor 21 comprises encircling or locating the transformer of the transducer 13 around the cross sectional perimeter of the electrical power circuit conductor 21. The side face plate of the circuit access panel 5 is removed to expose the conductors 21 associated with the distinct electrical power circuit conductors 21 for each electrical power circuits. Locating the transducer 13 around the electrical power circuit conductor 21 comprises locating the transducer transformer 131 of the transducer 13 in the magnetic field generated by the current flowing in the electrical power circuit conductor 21. Exposure to the magnetic field as described causes functional coupling 3 of the transducer 13 and the electrical power circuit.

Functional coupling 3 of the transducer 13 and the electrical power circuit causes induced electric current to flow in the transducer conductor 132 coupled to the transducer transformer 131. The induced electric current is ultimately output to components in the circuit testing station 10. Moreover, a separate transducer 13 can be used with each electrical power circuit and associated conductor 21 to enable the multiple induced electric currents associated with the several load variation devices 12 to be detected. Yet another embodiment of a transducer 13 (not shown) uses an infrared sensor to detect radiation associated with the current flowing in the electrical power circuit conductor 21. The infrared transducer 13 includes an infrared lens that detects temperature changes associated with the varying load condition induced by a load variation device 12.

The transducer 13 detects the electrical current flowing in the electrical power circuit conductor 21 to which it is coupled and generates a known linear output that is representative of the current flowing in the conductor 21 to which it is coupled. Moreover, it is preferred that each transducer output 142 comprise a differential output signal that is coupled or coupleable to a transducer input 141 of the testing station 10. It follows that the preferred means to couple the transducer 13 to the input(s) is a conductor 132 having paired complementary conductors to minimize amount of common mode noise detected and displayed in the scaled representation of the load current in the power circuit. Further, the testing station 10 has several transducer inputs 141, represented as: {input$_{n=0,1,2,N-1}$; where N is the number of circuits to be tested}, which permits that a plurality of transducers 13 and load variation devices 12 can be concurrently used with the testing station 10.

It is preferred that each of the transducer input circuits 141 include an analog to digital converter that converts the analog transducer output 142 into a digital representation (i.e. circuits$_N$ [0:N]), which is mapped to at least one memory 22 location. Storage of the load current data input in memory 22 permits the testing station 10 to display or graph the historic or real time transient load condition of each power circuit. Storage of the load current data input into memory 22 also enables the programmable controller 20 to perform mathematical operations on the sensed load condition. More particularly, by comparing the sensed load conditions on an electric circuit to specific amplitude and transient conditions representing each load variation device 12, the testing station 10 may detect each load variation device 12 and indicate with which electrical conductor 21 it is associated.

Within the testing station 10, a data representation of each power circuit current, represented as "Circuits$_N$ [0:N]" in FIG. 1, is coupled to a load variation detection function 16, which is represented as a load variation detection circuit or load variation detection program since it is appreciated that the load variation detection function 16 can be implemented using electronic devices or by electronic devices controlled by a software program, or in a combination thereof. Accordingly, the load variation detection function implementation is subject to a design choice provided that the implementation enables the testing station 10 to detect and distinguish each load variation device 12. Preferred designs of the load variation detection function 16 will include a filtering function which can be implemented in a variety of manners including software or hardware filters, or edge detection circuits. The filtering function permits the circuit testing station 10 to distinguish between the plurality of load variation devices 12 and other loads present on a electrical power circuit 2.

In a software or hardware filter implementation of the load variation detection function 16, the filter design passes and/or amplifies a particular frequency, or a range of particular frequencies, associated with the pulses that a particular load variation device 12 applies to a electrical power circuit 2. The filter also attenuates and/or discriminate against frequencies or periods other than the particular frequency or period of load variation detection device 12 pulses desired. In this implementation, a plurality of software or hardware filters are designed, and each software or hardware filter is designed to pass the distinguishing load variation frequency or period of one load variation detection device 12 and attenuate the other load variation frequency or period.

In an edge detection implementation, the load variation detection function detects load pulse durations and load pulse edge transitions. A characteristic load condition associated with one load variation device 12 comprises at least one initial transitional edge and a subsequent transition edge. Further, it is preferred, but not necessary, that the subsequent transition edge will be the opposite polarity of the initial transition edge. Further, it is expected that at least another subsequent transitional edge will occur at a predetermined time interval known to the testing station 10.

One implementing the load variation detection function 16 is to include a load pulse threshold detector and a pulse duration counter. The load pulse threshold detector includes a pulse amplitude detector that qualifies or measures the amplitude and the polarity of each pulse of load current in the conductor 21. If the pulse amplitude, as measured by the initial transition edge, is of the proper polarity and of sufficient or correct magnitude, the pulse duration counter is started. If the load current pulse is of sufficient duration (i.e. not the result of a noise spike on the conductor 21), the pulse duration counter is stopped or reset when the subsequent transition edge of the load pulse is detected. Additionally, the pulse duration counter may measure the time lapse between load pulses to determine the period of the load current pulses. Accordingly, if a load current pulse of appropriate magnitude, polarity and duration is detected, the testing station 10 may store the result, alert the user, trigger an alarm, and/or transmit the load current pulse detection to the portable display and control terminal 60. Accordingly, by programming the amplitude, the polarity, and the duration of each load pulse for each load variation device 12 into the tester station 10, a user can identify each of the plurality distinct load pulse characteristics associated with each load variation device 12.

The load variation detection function 16 is coupled to memory 22 and a display device 24 which displays a visual representation of the current flowing in the electrical power circuit 2 to which the load variation device 12 is coupled. By viewing the display device 55, the operator of the tester described herein can observer whether a particular receptacle 26 is associated with a electrical circuit breaker 52, which is also associated with a particular electrical circuit. Further, because the load variation detection function 16 is designed or programmed to identify the plurality of load variation devices 12, the operator may observe and distinguish between each load variation device 12.

Figure 8:
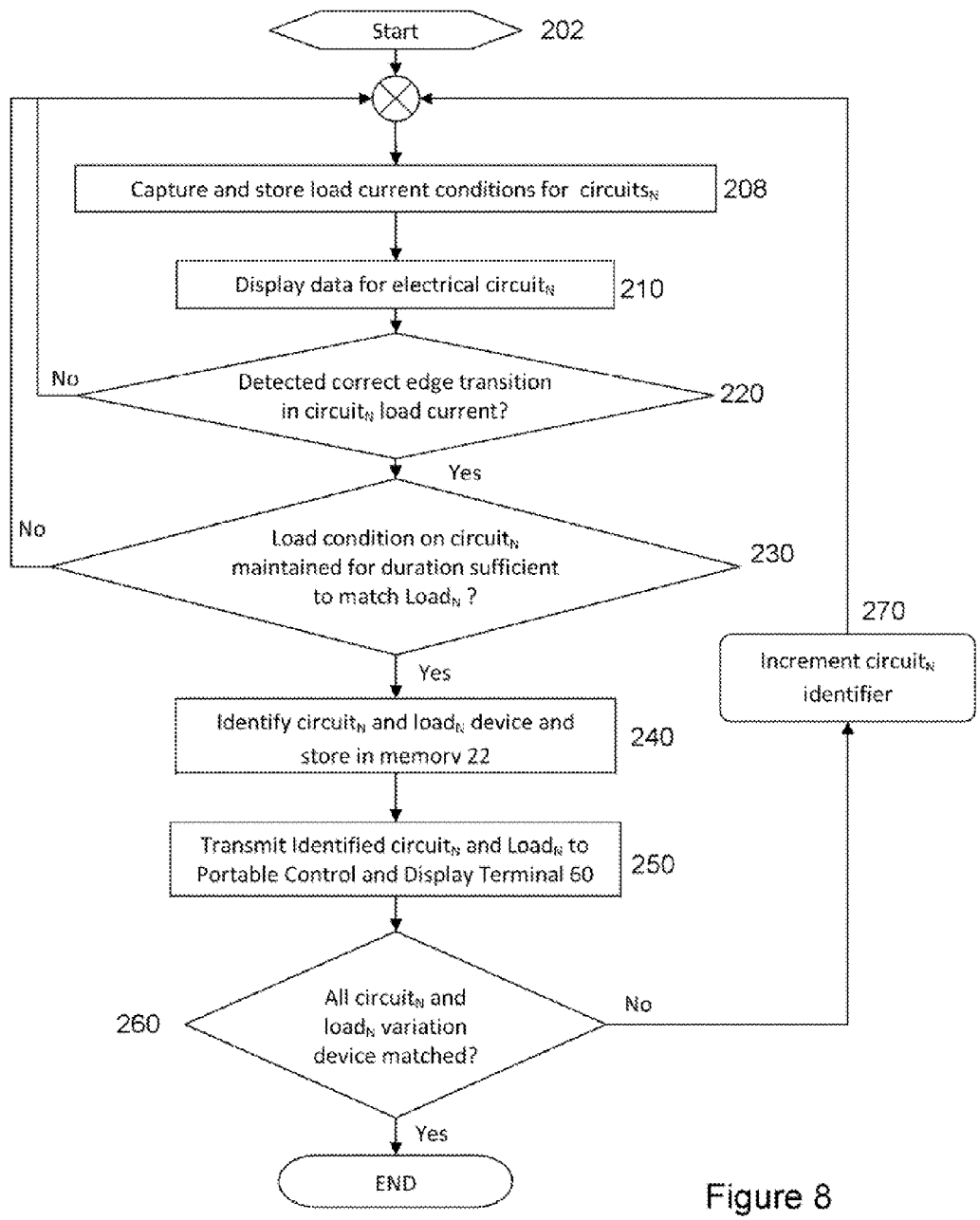
FIG. 8 illustrates a flow diagram for the load variation detection function.

FIG. 8 illustrates a flow chart of an implementation of the process for identifying and distinguishing the load characteristic(s) associated with a load variation device 12 (Load$_N$). After a start 202 of the program, which will include a boot up of the operating system on the programmable controller 20, the load variation detection software program is loaded into memory and run by the operating system of the programmable controller 20. The software program begins collecting and storing data 208 for the electrical circuits$_N$ for display 210 and/or future reference in mathematical operations. The software program also monitors the load current in circuit$_N$, and upon the detection of a load current transitional edge of correct polarity, starts a load pulse duration counter 220. If the load current pulse is maintained for a sufficient duration 230, the software program identifies the circuit to which the load variation device 12 is connected 240. Further, although not shown in the flow diagram, the software program can continue to monitor to see if a subsequent edge transitions also match the conditions of the same Load$_N$, which would iden-tify periodic load current pulse trains. The software program also transmits the identified circuit$_N$ and a Load$_N$ 250 to the portable control and display terminal 60. Finally, if all the circuits$_N$ are identified and matched with Load$_N$ 260, the software program terminates or waits for further command. Alternatively, if all the circuits$_N$ are not identified or matched with a Load$_N$ 260, the software program loops 270 looking for distinguishing load current characteristics associated with a Load$_N$.

Exemplary Implementation

It is noted that the following describes an exemplary implementation of the circuit tester components and that a person of ordinary skill in the art could modify or adapt the teachings herein to implement the aspects of the invention differently in either hardware, software or a combination thereof. Further, the description of commercially available components or the features of said components should not lead one of ordinary skill in the art to conclude that the design is limited to the features or limits of the disclosed components.

Figure 5:
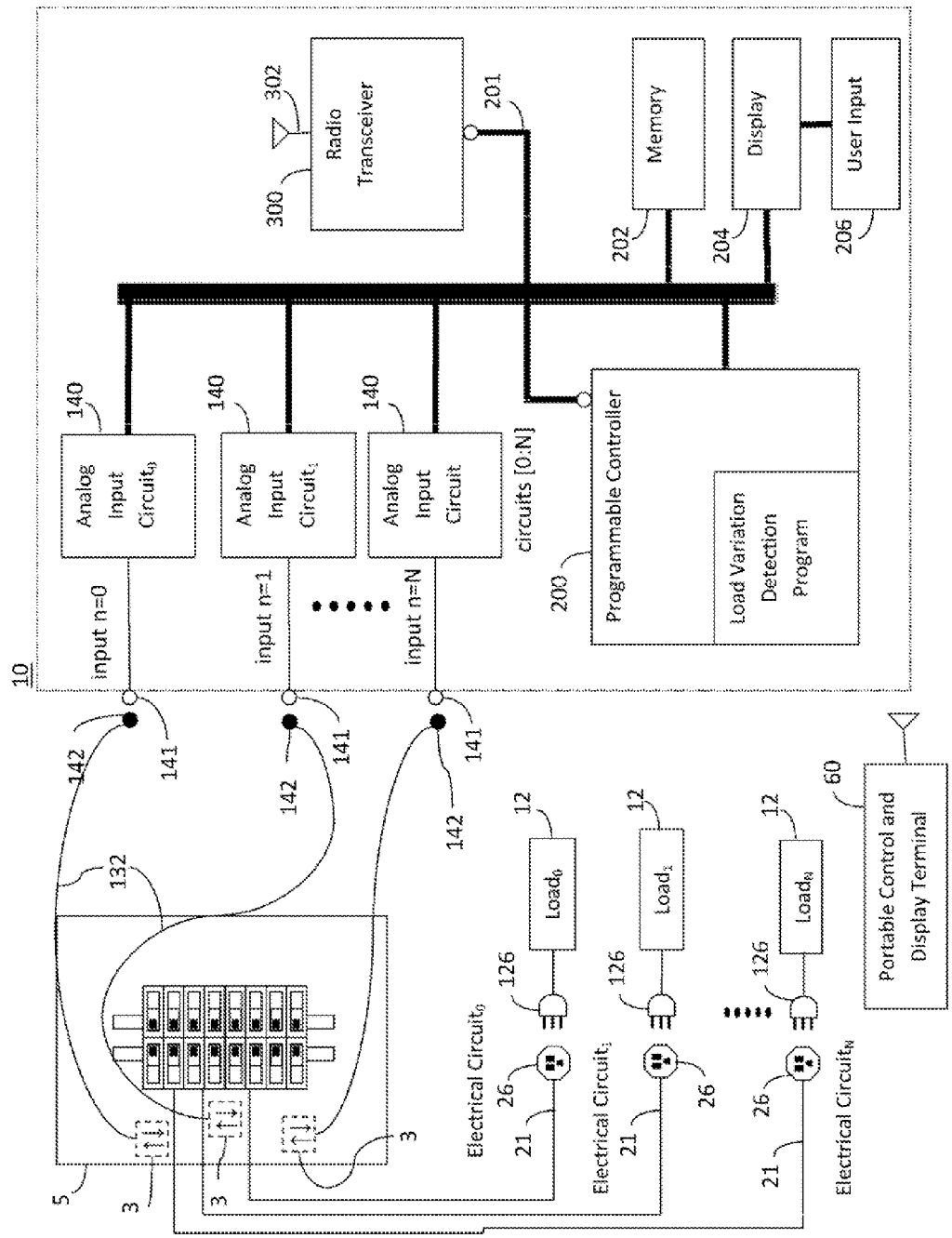
FIG. 5 illustrates a logical block diagram of an exemplary implementation of the circuit testing station 10. It is preferred that the portable display and control terminal 60 and/or the display 204 of the testing station each feature touch screen features.

Certain capabilities of the testing station 10 are implemented using a microcontroller to enhance the capabilities and facilitate the design of the testing station 10. FIG. 5 illustrates a logical block diagram of the exemplary implementation. The testing station 10 includes at least one analog input circuit 140 that is coupleable to the transducer outputs 142, and also coupled to a programmable logic controller (PLC), a microcontroller, or a microprocessor (hereafter "programmable controller 20") which is operating or running a load variation detection program 16. In the implementation, an OpenNet™ controller from IDEC IZUMI Corporation was used as the programmable controller 20. The programmable controller 20 is coupled to (or is integrated with) at least one memory device 22, and a display 24 having user input 26 capabilities to control the operation of the programmable controller 20 and the testing station 10.

Figure 4:
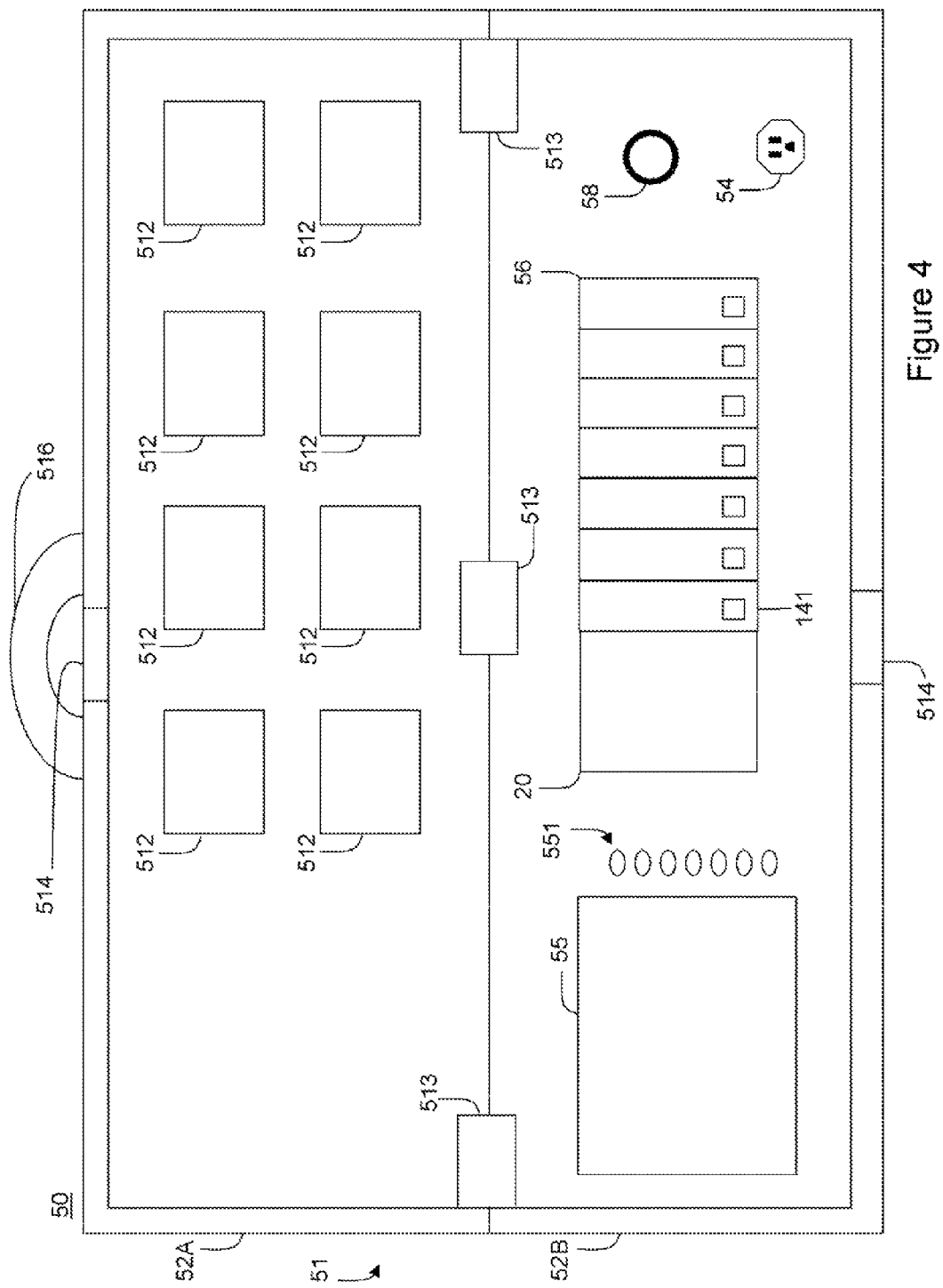
FIG. 4 illustrates a circuit testing station in a protective and portable case 50 for transport, storage and use of the circuit testing station 10.

The analog input circuit(s) 140 of FIG. 5 comprises a plurality of independent analog input circuits 140 implemented on independent channel analog input cards 56 (see FIG. 4) which are connectable and communicate with the programmable controller 20 over a data bus 201. In the implementation, the programmable controller 20 couples to a 6-channel Analog Input Module (Part No. FC3A-AD1261) that inputs standard four to twenty milliamp direct current (4 to 20 mA DC) current. Each transducer output 142 is coupled to one input of each analog input card 56.

Each analog input circuit 140 includes an analog to digital converter that translates the 4 to 20 mA DC signal from the transducer output 142 into a digital representation of the analog current sensed at the transducer 13 input. The digital representation of the analog current value is written to a memory location associated with the transducer input 141. Moreover, in the exemplary implementation, four milliamps output from the transducer output 142 is converted to zero units in a digital representation, and twenty milliamps (20 mA) output is converted into four thousand (4000) units in a digital representation. FIG. 2 illustrates the representation of each analog electrical current representation as circuits$_N$ [0:N].

The transducers 13 are functionally coupled 3, with magnetic field coupling, to electrical conductors 21 at the panel 5. Particularly, the transducers 13 are coupled around the electrical conductors. Transducer outputs 142 are coupled to the analog input circuits 140 and detect the distinguishable load characteristic associated with the at least one load variation device 12 according to the load variation and detection program running on the programmable controller 20.

The transducers 13 of the exemplary implementation comprise split magnetic field coupling transducers. Particularly, transducers 13 acceptable for use available as commercial embodiments and include, but are not limited to, the AC Current Transmitters from Absolute Process Instruments, Inc. having part numbers CTX-ACR-0, CTX-ACR-1, CTX-ACR-2 and CTX-ACR-3S, CTX-ACR-4S. The transducers 13 measure or sense true RMS AC in an associated conductor 21 up to 200 Amps AC and output standard four to twenty milliamp (4-20 mA) Direct Current. In the exemplary implementation, the transducer 13 is coupled to the electrical conductor 21 by encircling the transducer 13 the conductor 12. Power for the transducer is provided by the analog transducer inputs 141 of the testing station 10.

Figure 6:
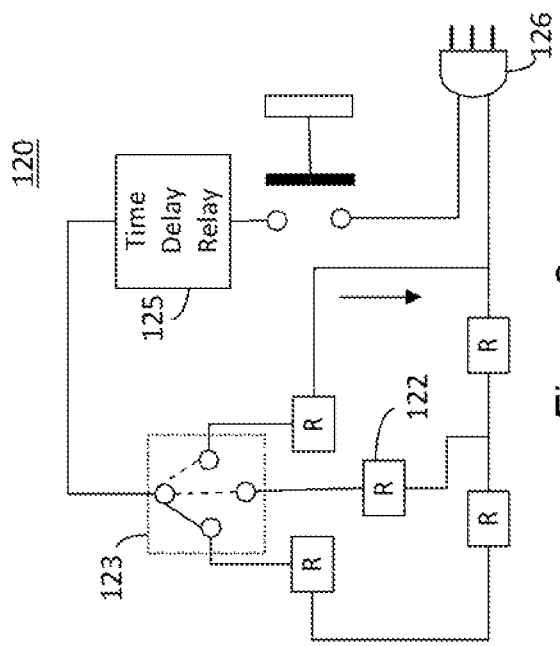
FIG. 6 illustrates an exemplary implementation of a load variation device 120.

A block diagram of an exemplary load variation device 12 is illustrated in FIG. 6. The load variation device 12 comprises a load variation circuit 120 including at least one alterable load element that is connectable to an access point in a power circuit. An exemplary load variation circuit 120 comprises a time delay relay 125 connectable in series with power resisters ("R") 122 that are selected and connectable with a three position switch 123 in alternate combinations to create the alternate load element connected to the power circuit by a plug 126. For example, in the illustration, with the three position switch 123 in the position shown, three (3) power resisters 122 will be connected across the hot and neutral wires of the power circuit. Similarly, the three position switch 123 also has positions that will connect both one (1) and two (2) power resisters 122 if desired. The time delay relay 125 is positioned in the load variation circuit 120 in series to enable the load condition to be connected to the power circuit for a time specified by the time delay relay 125. Accordingly, the load conditions connected to the power circuit may be altered both in magnitude, by adjusting the three position switch 123, and/or in duration, by setting the time delay relay 125 to pulse on and/or off (i.e. permit current flow) for a specified duration.

Figure 7:
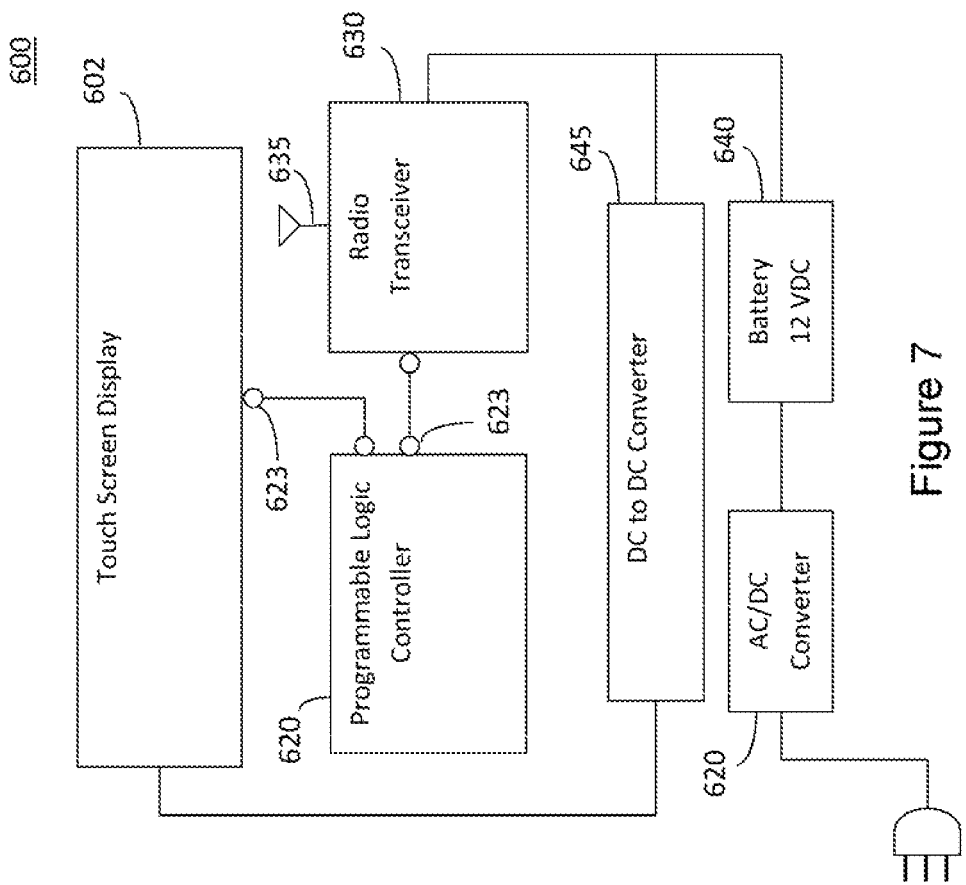
FIG. 7 illustrates an exemplary implementation of a portable display and control terminal 600 for communicating with, controlling, and/or viewing the data captured by the circuit tester station 10.

A portable display and control terminal 600 permits remote control and receipt of information captured by the tester 10. FIG. 7 illustrates a logical block diagram of the portable control and display terminal 60. The terminal 600 also incorporates a programmable controller 620 that is configured and programmed to allow remote control of the testing station 10 and review of the data displayed and/or captured by the testing station 10. The controller 620 communicates 623 via RS232 ports with a touch screen display device 602 and a radio transceiver 630 equipped with an antenna 635. Power to the terminal 600 is supplied either via battery 640 or via DC power created by a AD/DC converter 630 that is powered by and coupled to available electrical power by a plug.

Although the invention(s) have been described in detail with reference to one or more particular preferred embodiments, persons possessing ordinary skill in the art to which this invention pertains will appreciate that various modifications and enhancements may be made without departing from the spirit and scope of the claims that follow.

The invention claimed is:

1. An electrical circuit tester, for distinguishing between a plurality of electrical conductors having a plurality of respective load currents, comprising:
   a load variation device comprising at least one switch and load element for generating a single occurrence of a pulse of load current of specific amplitude and duration, the switch capable of being coupled to at least one of the plurality of electrical conductors;
   a testing station comprising,
      a plurality of transducer transformers capable of being respectively coupled to the plurality of electrical conductors having the plurality of respective load currents
      a plurality of sensing inputs respectively coupled to the transducer transformers, the sensing inputs respectively coupled by input-output circuits to an analog to digital converter coupled to at least one memory location storing at least one digital representation of one of the plurality of respective load currents, and
      a microprocessor coupled to the sensing inputs and operating a software program to compare digital representations of each of the plurality of respective load currents in the at least one memory location before and during the occurrence of the load current of specific amplitude and duration.

2. The electrical circuit tester in claim 1 wherein,
   the transducer transformers comprises split-core transducer transformers.

3. The electrical circuit tester in claim 2 wherein,
   the plurality of transducer transformers are coupled to the plurality of electrical conductors adjacent to circuit breakers in a circuit access panel.

4. The electrical circuit tester in claim 3 wherein,
   the analog to digital converter translates a signal from a transducer output into a digital representation of the analog current sensed at a transducer input.

5. The electrical circuit tester in claim 4 wherein,
   the digital representation is written to a memory location associated with the transducer.

6. The electrical circuit tester in claim 1 wherein,
   the load variation device includes a variable load capable of being connected between a live contact and a neutral contact of one of the plurality of electrical conductors.

7. The electrical circuit tester in claim 1 further comprising,
   a display device in communication with the microprocessor that gives a visual display signifying to which of the plurality of electrical conductors the current load is coupled.

8. The electrical circuit tester in claim 1 further comprising,
   a portable display terminal in remote communication with the testing station.

\* \* \* \* \*